United States Patent
Heinemann et al.

(10) Patent No.: US 7,323,390 B2
(45) Date of Patent: Jan. 29, 2008

(54) SEMICONDUCTOR DEVICE AND METHOD FOR PRODUCTION THEREOF

(75) Inventors: Bernd Heinemann, Frankfurt (DE); Dieter Knoll, Frankfurt (DE); Karl-Ernst Ehwald, Frankfurt (DE); Holger Rücker, Bad Saarow (DE)

(73) Assignee: IHP GmbH - Innovations for High Performance Microelectronics/Institut fur innovative Mikroelektronik, Frankfurt (DE)

( * ) Notice: Subject to any disclaimer, the term of this patent is extended or adjusted under 35 U.S.C. 154(b) by 319 days.

(21) Appl. No.: 10/496,531

(22) PCT Filed: Dec. 2, 2002

(86) PCT No.: PCT/EP02/13622

§ 371 (c)(1), (2), (4) Date: May 24, 2004

(87) PCT Pub. No.: WO03/046948

PCT Pub. Date: Jun. 5, 2003

(65) Prior Publication Data

US 2005/0023642 A1 Feb. 3, 2005

(30) Foreign Application Priority Data

Nov. 30, 2001 (DE) ............... 101 60 509

(51) Int. Cl.
H01L 21/31 (2006.01)
(52) U.S. Cl. ........... 438/282; 438/309; 438/362; 257/565; 257/E21.379; 257/E29.034; 257/E29.185
(58) Field of Classification Search .......... 438/282, 438/309, 362; 257/565
See application file for complete search history.

(56) References Cited

U.S. PATENT DOCUMENTS

| | | | |
|---|---|---|---|
| 4,381,953 A | 5/1983 | Ho et al. | |
| 5,321,301 A | 6/1994 | Sato | |
| 5,358,882 A | 10/1994 | Bertagnolli et al. | |
| 5,374,846 A * | 12/1994 | Takemura | 257/592 |
| 5,500,554 A | 3/1996 | Sato | |
| 5,571,731 A | 11/1996 | Grützediek et al. | |
| 5,656,514 A | 8/1997 | Ahlgren et al. | |
| 5,925,923 A | 7/1999 | Blair | |
| 5,950,080 A | 9/1999 | Yoshida | |
| 6,171,894 B1 | 1/2001 | Laurens | |
| 6,198,156 B1 | 3/2001 | Johansson et al. | |
| 6,426,265 B1 * | 7/2002 | Chu et al. | 438/312 |
| 6,441,437 B1 | 8/2002 | Gossner | |
| 6,627,972 B1 | 9/2003 | Ehwald et al. | |
| 2003/0020139 A1 | 1/2003 | Stengl et al. | |

FOREIGN PATENT DOCUMENTS

| | | |
|---|---|---|
| DE | 196 11 692 A1 | 10/1997 |
| DE | 199 57 113 A1 | 6/2001 |
| EP | 0 350 610 A2 | 6/1989 |
| EP | 0 534 271 A2 | 9/1992 |
| EP | 0 756 329 A1 | 7/1995 |
| EP | 0 762 511 A1 | 8/1996 |
| EP | 0 949 665 A2 | 4/1999 |
| EP | 1 020 923 A2 | 1/2000 |
| WO | WO/97/36328 | 10/1997 |
| WO | WO 98/09335 | 3/1998 |
| WO | WO 99/17369 | 4/1999 |

OTHER PUBLICATIONS

Patent Specification, 1,127,161 filed Nov. 30, 1965, No. 50687/65, Application made in Germany (No. S94398 VIIIc/21g) on Dec. 1, 1964, Complete Specification Published: Sep. 11, 1968, Improvements in or relating to Diffused Ease Transistors.

The Proliferation of Silicon Germanium, A. Schüppen, et al., TEMIC Semiconductor GmbH an ATMEL Company, Theresienstrasse 2, 74072 Heilbronn.

IEEE IEDM 90-33, 30 GGGHz Polysilicon-Emitter and Single-Crystal-Emitter Graded SiGE-Base PNP Transistors, D.L. Harame, et al., IBM Research Division, Yorktown Heights, NY, IBM General Technology Division, Burlington, VT, CH2865-4/90/0000-0033 1990 IEEE.

Yih-Feng Chyan et al., *A 50-GHz 0.25 μm Implanted-Base High-Energy Implanted-Collector Complementary Modular BiCMOS (HEICBiC) Technology for Low-Power Wireless-Communication VLSIs*, Bell Laboratories, Lucent Technologies, Orlando FL., 1998 IEEE BCTM 7.3 (pp. 128-131).

Yih-Feng Chyan et al., *A 50-GHz 0.25 μm High Energy Implanted BiCMOS (HEIBiC) Technology for Low-Power Wireless-High Integration Wireless-Communication Systems*, Bell Laboratories, Lucent Technologies, Orlando, FL., 1998 Symposium on VLSI technology Digest of Technical Papers, 1998 IEEE (pp. 92-93).

* cited by examiner

*Primary Examiner*—Alexander Ghyka
(74) *Attorney, Agent, or Firm*—Ware, Fressola, Van Der Sluys & Adolphson LLP

(57) ABSTRACT

The semiconductor device according to the invention includes a substrate, a field insulating region which delimits an active region of the semiconductor substrate, a collector, at least one collector contact region associated with the collector, and a base with an associated base connection region. The collector and the collector contact region are formed in the same active region. In addition the base connection region extends partially over the active region and is separated from the surface of the active region by an insulator layer.

57 Claims, 5 Drawing Sheets

SEMICONDUCTOR DEVICE AND METHOD FOR PRODUCTION THEREOF

CROSS REFERENCE TO RELATED APPLICATIONS

This application is for entry into the U.S. national phase under §371 for International Application No. PCT/EP02/13622 having an international filing date of Dec. 2, 2002, and from which priority is claimed under all applicable sections of Title 35 of the United States Code including, but not limited to, Sections 120, 363 and 365(c), and which in turn claims priority under 35 USC §119 to German Patent Application No. 101 60 509.9 filed on Nov. 30, 2001.

TECHNICAL FIELD

The invention concerns a semiconductor device, in particular a bipolar transistor, and a process for the production of such a semiconductor device.

BACKGROUND ART

Semiconductor devices such as for example the bipolar transistor have long been state of the art and are used in many different ways, for example in analog and digital integrated circuits. The component parts of a bipolar transistor include an emitter as a charge carrier source, a collector as a charge carrier drain (charge carrier outlet) and a base as the control device for controlling the flow of current between the emitter and the collector.

The emitter and the collector nowadays frequently consist of silicon (chemical symbol: Si) of a given conductivity type whereas the base consists of silicon of the opposite conductivity type. There are two different conductivity types in semiconductor materials such as for example silicon. Semiconductor materials with electron as charge carriers are referred to as n-conducting, while those with holes as charge carriers are referred to as p-conducting. In pure silicon, both kinds of charge carriers are present in equal concentrations, and in that case this is referred to as intrinsic silicon. If the charge carrier concentration is increased by the introduction of foreign atoms, referred to as doping substances, that is referred to as doping. n-Doping occurs if the doping substance introduced is an n-doping substance (donor), that is to say one which leads to an increase in the concentration of electrons as charge carriers. The material then becomes n-conducting. For example phosphorus (P), arsenic (As) and antimony (Sb) are used as the n-doping substance. On the other hand, p-doping exists if the doping substance introduced is a p-doping substance (acceptor), that is to say one which leads to an increase in the concentration of holes as charge carriers. The semiconductor material then becomes p-conducting. For example boron (B), indium (In) and gallium (Ga) are used as p-doping substances. If the increase in concentration of electrons/holes after the doping operation is very great or very slight, that affords a highly doped semiconductor material ($n^+/p^+$-doping) and a weakly doped semiconductor material ($n^-/p^-$-doping) respectively.

Three processes are available for doping a semiconductor material: ion implantation and diffusion, in each case after producing the layer to be doped, and introduction of the doping substance in situ, that is to say when depositing the layer to be doped. In addition, a distinction is drawn as to whether the doping substance occupies an interlattice position, that is to say is present in interstitial form, or assumes a lattice position in the layer, that is to say it is substitutionally incorporated.

Accordingly, the above-described bipolar transistor can be for example an npn-transistor. The designation npn-transistor means that the collector and the emitter are n-doped, whereas the base is p-doped. Instead of being in the form of an npn-transistor, it is also possible for it to be in the form of a pnp-transistor. In that case the dopings are reversed in comparison with the npn-transistor.

In the case of bipolar transistors a distinction is drawn between horizontal bipolar transistors, also referred to hereinafter as lateral bipolar transistors, in which the collector, the base and the emitter are arranged in horizontally mutually juxtaposed relationship, and vertical bipolar transistors in which the the collector, the base and the emitter are arranged in mutually superposed relationship. Frequently bipolar transistors are produced using silicon technology (Si-bipolar transistors). The conductivity of vertical Si-bipolar transistors (referred to English as: bipolar junction transistor BJT) in the high-speed range is markedly improved by the use of an epitaxially produced base layer. Further power reserves were achieved in particular with the integration of an epitaxially produced layer sequence comprising silicon (Si)/silicon-germanium alloy (SiGe)/silicon (Si/SiGe/Si layer sequence) into bipolar or BiCMOS processes. The doping for the base of the bipolar transistor is introduced into the SiGe-layer. This is referred to as an SiGe heterobipolar transistor, referred for brevity as an SiGe-HBT. The band gap in the SiGe-layer, which is smaller in comparison with Si, leads to increased injection of minority charge carriers into the base, in comparison with conventional Si-bipolar transistors. That physical effect but also the precise deposit and doping of the epitaxial layers on an atomic length scale, which can already be implemented on an industrial scale, is utilized to reduce both the transit times of the charge carriers in the base and also the base resistance. Those properties afford higher transit frequencies $f_T$ and maximum oscillation frequencies $f_{max}$ and lower high-frequency (HF) noise. An additional increase in conductivity in the high-speed range requires the reduction of the parasitic components, in particular external base resistance, base-collector and collector-substrate capacitance, collector resistance and also the charge carrier transit time in the base-collector space-charge region.

In order to expand the width of use of bipolar transistors in circuits, integration on one chip of transistors with different collector-emitter breakdown voltages (abbreviation in the English literature BVCEO) is advantageous. Various BVCEOs cause a different power performance for the transistors in the high-speed range. The solutions known from the literature, see for example A. Schüppen, M. Tortschanoff, J. Berntgen, P. Maier, D. Zerrweck, H. von der Ropp, J. Tolonics and K. Burger: "The proliferation of Silicon Germanium", Cork, Ireland, ESSDERC 2000, pages 88 ff, Sep. 11 through 13, 2000, use for that purpose selectively implanted collector (SIC) regions which produce the connection to a buried, highly conductive layer (referred to in English as the buried layer). The breakdown voltage is adjusted by way of the spacing of the buried layer from the base layer, which at the same time defines the extent of a low-doped collector layer (referred to English as the low-doped collector LDC) and the doping substance concentration of the SIC regions. Different demands are made on the LDC width if transistors with differing SIC-doping and consequently differing BVCEO are to be optimized in respect of best possible power performance in the high-speed range. That solution inevitably involves a compromise to the detriment of the high-speed properties of the transistors with a lower breakdown voltage. The reason for this is that a certain minimum width of the LDC is necessary for providing the greatest desired breakdown voltage and that for transistors with a lower breakdown voltage, that results in an additional damaging contribution to collector resistance, which leads to a reduction in power in the high-speed range. That disadvantage can be only partially compensated by a suitable configuration in respect of the SIC doping, because in that respect limits are imposed in respect of the profile steepness, conductivity and freedom from defects, which do not exist in relation to a buried layer, in particular an epitaxially buried layer.

There are also solutions in which the depth of the buried layer is not established by means of an epitaxial layer but in which the depth of the doping profile is established by the energy of the ions in an implantation operation (epitaxy-free buried layer). Because of the opposing demands in terms of the implantation parameters which on the one hand aim for a sufficiently great LDC width and which on the other hand seek to achieve a profile gradient which is as steep as possible for the buried layer, the known structures based on an epitaxy-free buried layer, for a greater BVCEO, that is to say about >6V, did not achieve the power parameters in the high-speed range, as are known for an epitaxially buried layer.

Besides the requirement for a higher level of performance, in particular the cost factor causes modifications to the transistor structure or process technology, as set forth for example in WO 00/14806. That publication proposes a transistor structure which avoids the otherwise usual features of a deep trench and an epitaxially buried, high-doped sub-collector layer, without in that respect having to tolerate impairments worth mentioning in the high-frequency properties due to increased collector resistances or collector-substrate capacitances. That arrangement however does not disclose for example any results which at the same time show BVCEO values of greater than 6V and very good high-frequency properties.

DISCLOSURE OF THE INVENTION

In comparison with the known state of the art, the object is to provide improved bipolar transistors with various breakdown voltages in a less expensive fashion. In comparison with the state of the art described in WO 00/14806, in particular the object is that of furthur improving the transistor arrangement and the processes for integration of the transistor for example into a CMOS technology.

Those objects are attained by a semiconductor device, a semiconductor chip, and a process, each according to one or another aspect of the invention.

In accordance with a first aspect of the invention, the semiconductor device includes a substrate, a field insulating region which delimits an active region of the semiconductor substrate, a collector, at least one collector contact region associated with the collector and a base with an associated base connection region. The collector and the collector contact region are formed in the same active region. In addition the base connection region extends in part over the active region and is separated from the surface of the active region by an insulator layer.

The semiconductor device according to the first aspect of the invention can be in particular a bipolar transistor with an epitaxial base. In such a bipolar transistor with an epitaxial base, in accordance with the invention the inner transistor region which denotes the vertical strip consisting of semiconductor material between the emitter and the collector, which is approximately of the width of the emitter window, and the collector connection and contact region are in one and the same active region, referred to for brevity as the transistor region. This means that the inner transistor region and the collector connection and contract region are not separated by insulating regions, referred to for brevity as field insulating regions, which typically project some 100 nm into the substrate. In addition the bipolar transistor with epitaxial base includes at the substrate surface of the active transistor region insulating regions of second type, which in particular lie between an inner base region and the collector contact region and which can be covered with a conductive layer making the connection of the base contact to the inner base region.

In addition the bipolar transistor according to the invention with epitaxial base may include a buffer layer forming the substrate-side part of the epitaxial layer stack which also includes the epitaxial base. The buffer layer has at least partially monocrystalline growth along the side wall of the insulating regions of second type.

There may be high doping of the conductivity type of the base in the polycrystalline regions, which affords the connection between the base contact and the inner base region, referred for brevity as the polycrystalline base connection region. It is remote from the substrate surface in a vertical direction at least by the thickness of the monocrystalline part of the buffer layer. Such an arrangement improves the high-frequency properties by reducing the base and collector resistances and by virtue of reduced base-collector and collector-substrate capacitances.

In a further configuration the bipolar transistor with epitaxial base is distinguished by collector doping which is delimited laterally by the side wall of the field insulating region which surrounds the transistor region.

In a configuration of the invention the collector doping is such that the concentration does not exceed values of $5 \times 10^{17}$ $cm^{-3}$ at least as far as a distance of 30 nm from the base layer.

In a further embodiment of the invention the doping substance concentration of the collector doping in the transistor region at the substrate surface, that is to say at the interface between the collector and layers deposited thereon, is at least $5 \times 10^{17}$ $cm^{-3}$. Preferably it is at least $3 \times 10^{18}$ $cm^{-3}$ and further limitedly at least $1 \times 10^{19}$ $cm^{-3}$. That applies in each case over the entire lateral extent of the transistor region. This embodiment has the advantage that the conductivity of the collector is also high near the substrate surface. While in the state of the art it was necessary to provide a depth portion of low collector doping near the substrate surface, that portion can be omitted here. Tunnel currents or leakage currents between the base and the collector are preferably avoided in the transistor in this embodiment by means of a buffer layer between the collector and the base. In addition the compromise which is usual in the state of the art, between different demands in terms of the thickness of the low-doped collector layer which is near the surface, does not arise. That layer should be sufficiently thin for the purposes of better high-speed properties of the bipolar transistors, on the one hand. On the other hand however the thickness that this requires would be too small to be able to achieve for example sufficiently low capacitances in respect of the source/drain regions of MOS-transistors with respect to the well region, as are required for example in a BiCMOS arrangement.

In accordance with a further configuration of the invention the field insulating regions can comprise shallow insulating trenches which extend to a depth of 300-600 nm or, optionally additionally, they can comprise deep insulating trenches with a depthwise extent of 1,000-20,000 nm.

In a further configuration of the invention the insulating regions of second type can comprise a single type of insulating material or a combination of various ones.

In a further configuration of the invention the side walls of the insulating regions of second type can be completely or partially covered by spacers which influence seeding with semiconductor material during an epitaxy step.

In another configuration of the invention the insulating regions of second type are at least partially and preferably completely covered with a metal or a silicide layer. That metal or silicide layer can be completely or partially covered by a semiconductor layer.

The inner opening of the insulating regions of second type, which encloses a part of the inner transistor region, is completely enclosed by the field insulating regions in an embodiment of the invention.

Preferably the laterally spacing of the inner opening of the insulating regions of second type from the inner boundary of the field insulating regions is at least 25 nm.

In a configuration of the invention the epitaxial base layer contains an alloy of the substrate material and a further semiconductor material. If the substrate material comprises Si the layer may contain alloys with Ge or C.

In a configuration of the invention an Si-buffer or Si-cap layer may also contain C in a concentration of $5\times10^{18}$ cm$^{-3}$ to $2.5\times10^{20}$ cm$^{-3}$ in order to impede or speed up the diffusion of given doping substances, in particular to impede the diffusion of boron or phosphorus. Doping of the base or cap layer with C is intended in particular to suppress the diffusion of a high doping of boron or phosphorus from the polycrystalline base connection regions into the monocrystalline part of the buffer layer.

In accordance with a further aspect of the invention a semiconductor device according to the invention includes a base, a collector, a collector contact region and a doping which extends in the lateral direction at least through a part of the collector. The doping has a concentration profile, referred to for brevity as the profile, with a base-side flank on which the level of doping substance concentration increases by at least 2 orders of magnitude with increasing depth over a depth region of less than 150 nm.

In a preferred embodiment of that semiconductor device the increase in the doping substance concentration by at least 2 orders of magnitude with increasing depth occurs over a depthwise region of up to 150 nm, calculated from the collector-side base limit.

In a further embodiment the level of doping concentration increases by at least 2 orders of magnitude with increasing depth over a depth region of up to 80 nm, calculated from the collector-side base limit.

In a further embodiment the level of doping concentration increases by at least 2 orders of magnitude with increasing depth over a depth region of up to 40 nm, calculated from the collector-side base limit.

In a further preferred embodiment the level of doping substance concentration increases starting from a reference level of $1\times10^{17}$ cm$^{-3}$.

In another configuration of the invention which is also beneficial for use in the semiconductor device as set forth in claim 1 the profile has a substrate-side flank. The profile of the doping, in particular the collector doping, is such that the part of the profile which drops towards the substrate approximately attains the concentration of the substrate doping at the depth of the bottom of the field insulating regions.

In an embodiment of the invention the doping and in particular the collector doping is such that the concentration exceeds values of $5\times10^{18}$ cm$^{-3}$ at a distance of at most 70 nm from the base layer.

In accordance with a further aspect of the invention the process for producing a semiconductor device includes the following steps: depositing an insulator layer on a part of the surface of an active region of a semiconductor substrate, which subdivides the active region into a collector and at least one collector contact region, depositing a base layer on the collector and depositing a polycrystalline layer on the insulator layer.

The process according to the invention is in particular a process for producing the bipolar transistor with an epitaxial base. In an embodiment it provides that the collector doping is such that no further epitaxy step is applied between the operation of introducing the collector doping and the epitaxy step for base production which can also include the joint production of a buffer and cap layer.

In a further step in the process the epitaxial base or the layer stack consisting of buffer, base and cap layers can be produced with differential epitaxy or with selective epitaxy or can be produced by changing from one kind of epitaxy to the other.

In accordance with a further aspect of the invention the semiconductor device includes a substrate and a collector. The collector includes a collector doping, whose doping profile is substantially homogenous in the vertical and/or lateral direction and which is such that it rises scarcely or not at all towards the substrate. The semiconductor device as set forth in claim 38 can be in particular in the form of a vertical or lateral bipolar transistor.

In particular the semiconductor device can be a bipolar transistor in which there is arranged in the collector region a substantially homogenous collector doping which rises scarcely or not at all towards the substrate (also referred hereinafter as collector doping of the fourth type). The collector doping of fourth type can be surrounded by a high level of doping laterally selectively from one side, at two sides, in an U-shape or in an annular shape.

In a configuration of the invention the high doping extends from the substrate surface at least to a depth which corresponds to the substrate-side limit of the base-collector space-charge zone when the collector-emitter breakdown voltage is reached.

In a further configuration of the invention a buried layer as is typically used as a sub-collector for bipolar transistors or a well as is typically used for MOS-transistors is used as the high doping. In addition there is a source-drain high doping in the region near the surface.

In an embodiment of the invention the lateral spacing of the high doping relative to the inner transistor region is altered, thereby making use of an additional degree of freedom for adjusting the collector-emitter breakdown voltage.

In a further configuration of the invention transistors of the arrangement according to the invention are produced on a chip jointly with conventional bipolar transistors of the kind such that there is a buried layer and/or a CMOS well continuously or partially continuously under the inner transistor region.

The arrangement according to the invention makes it possible to produce bipolar transistors with a differing collector-emitter breakdown voltage with a lower level of process expenditure than in comparison with known solutions and without an adverse effect on the high-frequency properties of the transistor variants.

In accordance with a further aspect of the invention a process for producing a bipolar transistor includes the following steps: introducing a collector doping (116) such that the doping profile is substantially homogenous in the vertical direction and rises scarcely or not at all towards the substrate, and introducing a high doping such that it is laterally in contact with the collector doping.

The process according to the invention can be used in particular for producing the bipolar transistor as described hereinbefore. It can include implementation of the high doping in a single doping step or in a plurality of doping steps. The position of the high doping with respect to the substrate surface can be adjusted by means of implantation or it can be additionally varied by applying an epitaxy layer.

BRIEF DESCRIPTION OF THE DRAWINGS

The present invention is described in detail hereinafter with reference to the accompanying drawings.

DETAILED DESCRIPTION OF THE INVENTION

Figure 1:
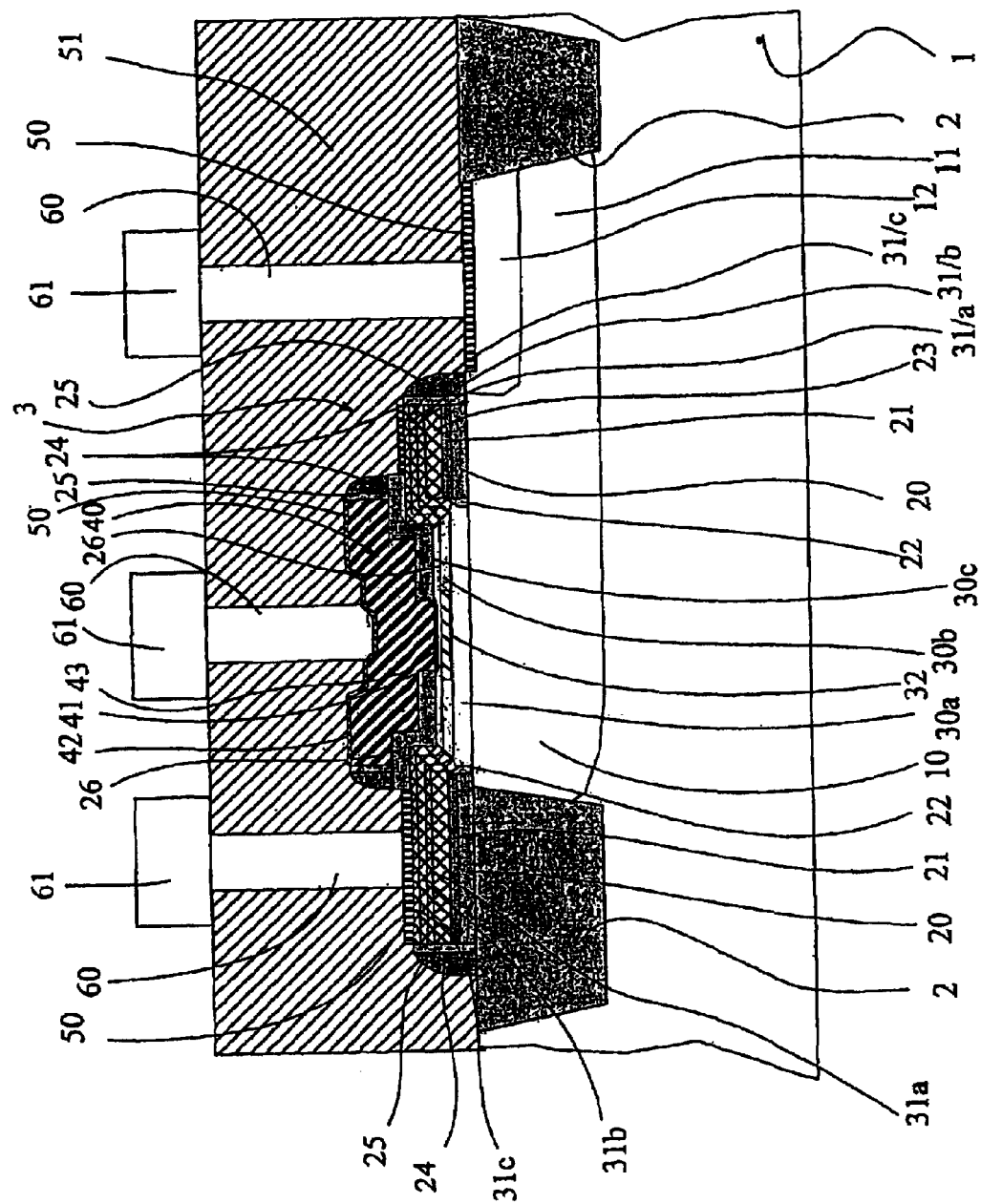
FIG. 1 shows a view in cross-section of a semiconductor device according to the invention in the form of a bipolar transistor with an epitaxial base.

The invention is described below using two examples.

EXAMPLE 1

The bipolar transistor according to the invention with an epitaxial base will now be described with reference to FIG. 1. In this example an npn-bipolar transistor is produced on a high-ohmic, monocrystalline p⁻-conductive Si-substrate 1. The arrangement described here is not limited to p⁻-conductive Si-substrates. The essential features can for example also be transferred to compound semiconductors or substrates of the opposite conductivity type. The opposite conductivity type of the substrate can be used without additional measures in the case of a pnp-bipolar transistor. The description however can also be applied to the pnp-bipolar transistor when based on a p⁻-substrate. In that case the transistor regions are to be shielded on all sides towards the substrate by a contacted n-doping. That measure can also be transferred to npn-transistors if based on an n⁻-substrate.

The npn-bipolar transistor with epitaxial base includes an n-conducting collector 10 and an also n-conducting emitter 40. The collector is taken to the contact laterally by way of the collector contact region 11 and a collector connection doping 12. Between the emitter 40 and the collector 10 there is a monocrystalline layer stack 30 which is prolonged laterally in the form of a polycrystalline layer stack 31. The layer stack 30 includes the p-conducting base layer 30b. The inner base layer 32 is defined in a horizontal direction approximately by the width of the emitter window 41. Laterally the inner base layer 32 is connected by way of a monocrystalline region of the base layer 30b and further outwardly by way of the highly conductive arrangement, in mutually superposed stacked relationship, of the layer stack 31 and the layer 23. All conductive portions which form the connection between the inner base layer 32 and the base contact will be referred to as the base connection region.

A first type of insulating regions 2, referred to hereinafter as field insulating regions, projects from the substrate surface into the substrate region. So-called shallow-trench insulations can be used as the field insulating regions. These involve preferably between 300 and 600 nm deep trenches which can be filled for example with silicon dioxide ($SiO_2$) but also with a combination of insulator material and polysilicon. It is also possible however to use field insulating regions produced by means of local oxidation (LOCOS). Furthermore, in addition to the shallow field insulating regions, it is also possible to use deep trenches filled for example with $SiO_2$, which however are not present in the arrangement shown in FIG. 1. Between the field insulating regions 2 at the substrate surface there are islands of monocrystalline silicon regions, the so-called active regions. The bipolar transistor with epitaxial base according to the invention is arranged in one of the active regions. It includes the collector 10 which is disposed in the substrate and which is delimited laterally by the side walls of the field insulating regions 2. Insulating regions of second type are produced on the substrate surface. In the preferred case they comprise insulator layers 20, 21 which are layered in vertically mutually superposed relationship. It is however also possible to use for example only one insulator layer or a third layer. The number, chemical composition and thickness are selected according to the requirements of process integration and component properties. From the point of view of process integration, such properties like selectivity in wet-chemical and dry-chemical etching or the properties as a protective layer for other process modules, like for example CMOS transistors, are a selection criterion. In regard to the component properties the capacitance of the layer or layers but also the growth behavior of epitaxial layers in the area around the insulating layers play an important part.

In the described example shown in FIG. 1 the layer 20 is a $SiO_2$ layer which is between 1 nm and 100 nm thick, preferably between 10 and 50 nm thick. Thereover there is a silicon nitride ($Si_3N_4$) layer 21 which is between 10 nm and 100 nm thick, preferably between 20 nm and 50 nm thick. In the embodiment of FIG. 1 two partial regions of the insulating region of second type are disposed in the plane of the substrate surface. One of those partial regions is disposed both on the field insulating region 2 and also on the active region, and the second is disposed completely on the active region. It will be shown hereinafter that the two partial regions are joined together as a ring in a plane perpendicularly to the cross-sectional plane in FIG. 1.

The collector 10 is covered by a monocrystalline layer stack 30 produced in an epitaxy step. The monocrystalline buffer layer 30a is deposited at the substrate side. That layer can be between 5 nm and 150 nm, in particular between 5 and 80 nm, preferably between 20 nm and 130 nm, in particular between 20 and 60 nm, in thickness. The p-doped base layer 30b is produced above the buffer layer. The thickness of the base layer can be between 5 nm and 10 nm, preferably between 10 nm and 35 nm. Base doping of the described npn-Si-bipolar transistor can be produced in situ, that is to say during the epitaxy process or after the epitaxy step by implantation. Preferably boron is introduced in situ as the base doping. With the known means it is possible to produce a heterobipolar transistor on a Si-base by the incorporation of Ge or C. At low levels of concentration of less than 0.5% C can advantageously serve to reduce the diffusion of doping substances, the diffusion of which is based on an interaction mechanism with interlattice atoms. Besides phosphorus, that also includes boron which is preferably used as a doping substance for the base of an npn-bipolar transistor. Over the base layer, there then follows a cap layer 30c which is between 10 nm and 100 nm and preferably between 20 nm and 50 nm in thickness.

If operation is implemented with selective Si-epitaxy layers grow only on Si-regions during the epitaxy process. With differential Si-epitaxy Si-layers are also deposited on insulator regions. The arrangement with epitaxial base according to the invention is preferably produced by differential epitaxy.

In that respect, in terms of the function of the base connection, it is immaterial whether conductive material is or is not present on the insulating regions of second type. The embodiment of FIG. 1 includes on the insulating regions 20, 21 a conductive layer 23 which was already produced prior to the epitaxy process. That can involve polysilicon but also a metal silicide layer or a combination of the two.

Because of the risk of metal atoms being liberated in subsequent process steps the metal silicide layer can also be encased by other materials, for example polysilicon.

When the layer 23 is present the base connection can also be embodied without additional measures by selective epitaxy. When differential epitaxy is used the polycrystalline layer stack 31 grows over the layer stack 20, 12, 23.

Spacers 22 preferably comprising $SiO_2$ can be present at the side walls of the insulator layers 20, 21. The spacers 22 are intended to be used to delay lateral seeding of the insulator layers 20, 21 during the epitaxy step for production of the epitaxial base. It is know per se that for example under given epitaxy conditions seeding on $SiO_2$ is initiated later than on $Si_3N_4$. That so-called selectivity difference is utilized in the present case in order to cause the buffer layer 30a to grow at least partially in monocrystalline form at the lateral transition to the insulating regions 20, 21. More specifically, if seeding at the side wall were to begin prior to or simultaneously with seeding of the silicon surface, the so-called facet, that is to say the interface between the monocrystalline layer stack 30 and the polycrystalline layer stack 31, would extend as far as the surface of the substrate region 1.

An at least partially monocrystalline portion of the buffer layer but also the base and cap layer, along the side wall of the insulating regions of second kind indicated at 20, 21 can also be produced by changing the mode of deposition from selective to differential or by pure selective epitaxy. In this case the insulating regions of second kind can also comprise $SiO_2$ preferably completely or at least partly at the surface in order to prevent or delay polycrystalline seeding in the area around the inner transistor region during epitaxial growth of the buffer layer. The purpose of that monocrystalline portion is to be able to control the spacing of high dopings of the collector and the polycrystalline base connection region in that portion. Thus, boron diffusion from the polycrystalline base connection region can be effectively suppressed by the incorporation of C into the buffer or base layer. A polycrystalline bridge between the high dopings causes accelerated diffusion and/or increased leakage currents.

Disposed above the layer stack 30 and 31 respectively is a structured insulator layer 26. It can preferably comprise an $SiO_2$-layer which is between 10 nm and 150 nm in thickness, in particular between 10 and 60 nm and preferably between 30 and 50 nm in thickness. It may however also be composed of a combination of various insulator materials.

The opening in the insulator layer 26 over the layer stack 30 defines the emitter window 41. To produce the emitter window, an auxiliary layer, for example amorphous Si, can be structured for example by means of a lacquer mask. This so-called hard mask (not shown in FIG. 1) is used to transfer the emitter window into the insulator layer 26 in a wet etching step. A highly doped silicon layer of the conductivity type of the collector, the emitter layer 42, covers the emitter window 41 and the insulator layer 26.

The emitter layer 42 can be deposited in the form of a polycrystalline, amorphous, partially monocrystalline-partially polycrystalline or monocrystalline material. During a high-temperature step, n-doping substance can diffuse out of the highly doped emitter layer 42 into the layer stack 30 through the emitter window 41. In this case the emitter 40 includes the emitter layer 42 and the n-region 43 which has diffused in. The resulting outer boundary of the emitter layer 42 is preferably so configured by etching by way of lacquer mask that the side surfaces of the emitter layer 42 project laterally beyond the inner side surfaces of the insulating regions of second kind 20, 21. In that way, after etching of the emitter layer 42, doping of the layer stack 31 and the layer 23 of the conductivity type of the base can be implemented by implantation in such a way that the offshoots of that implantation operation are kept away from the collector 10.

The outer boundary of the layers 30 and 23 is structured by way of a lacquer mask. The emitter layer as well as the insulator layers of second kind 20, 21 and the layers 30 and 23, at the side walls, are then provided with a spacer comprising a double layer $SiO_2/Si_3N_4$ 24, 25.

After spacer formation the active regions which are covered with a preferably between 1 nm and 20 nm thick $SiO_2$ residual layer are etched free by a wet chemical process. A subsequent silication step produces the silicide layers 50 which are still better conductive in comparison with highly doped Si.

However the provision of those spacers 24, 25 can also be omitted as the emitter and the base, or the base and the collector respectively, are electrically insulated from each other, even without those spacers, by the insulator layer 26 and by the second-type insulating regions respectively or the field insulating regions 2 after a silication step. This variant (not shown here) can afford the advantage that the side walls of the emitter layer 42 and of the polycrystalline layer stack 31, 23 are also silicated and the emitter and base resistances can be reduced.

The surface of the transistor and insulating regions is covered by an insulator layer or layer combination 51. Contact holes 60 filled with conductive material and metal strips 61 disposed thereover afford the electrical connection to the contact regions of the transistor.

Figure 2:
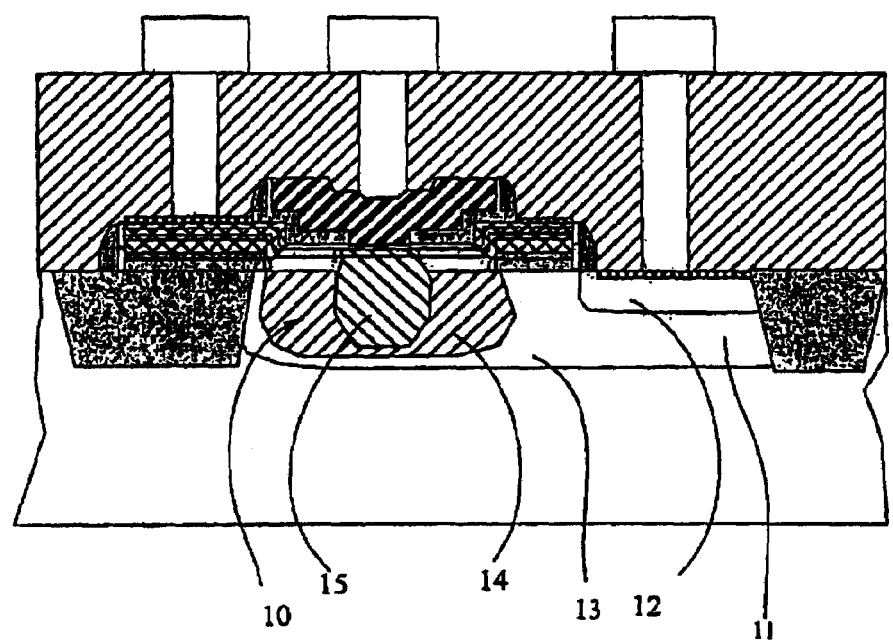
FIG. 2 shows configurations of the collector doping.

FIG. 2 shows configurations of the collector doping. The collector region 10 and the collector contact region 11 are provided in this example of an npn-bipolar transistor with an n-conductive, first collector doping 13 extending between the side walls of the adjoining field insulating region. The vertical extent preferably attains the extent of the field insulating regions 2. If the first collector doping 13 is introduced prior to the base epitaxy step, for example with a structured lacquer mask, doping substance can pass into the buffer layer 30a thereabove by diffusion during a temperature treatment.

The dose of the implantation procedure is preferably so selected that the result is a low level of collector resistance. The dose can be in the range of between $1 \times 10^{13}$ cm$^{-2}$ and $5 \times 10^{15}$ cm$^{-2}$, preferably between $2.5 \times 10^{14}$ cm$^{-2}$ and $2 \times 10^{15}$ cm$^{-2}$, limited between $2.5 \times 10^{14}$ cm$^{-2}$ and $1 \times 10^{15}$ cm$^{-2}$ and still more limited between $2.5 \times 10^{14}$ cm$^{-2}$ and $5 \times 10^{14}$ cm$^{-2}$. A second preferred range is between $1 \times 10^{15}$ cm$^{-2}$ and $5 \times 10^{15}$ cm$^{-2}$.

Phosphorus (P), arsenic (As) and antimony (Sb) can be considered as ions for the implantation operation. In addition, for reasons of a low level of collector resistance, a rise which is as abrupt as possible in respect of the first collector doping 13 on the emitter-side flank of the profile is advantageous. That can be achieved for example by implantation with As or Sb.

The Table hereinafter lists in the left-hand column various preferred energy ranges for the implantation of As or Sb. The middle column sets out the corresponding depths of the maximum of the As profile while the right-hand column sets out the corresponding depths of the maximum of the Sb profile.

| Energy range [keV] | Depth of the profile maximum with As doping [nm] | Depth of the profile maximum with Sb doping [nm] |
| --- | --- | --- |
| 50 ... 1000 | 35 ... 600 | 24 ... 400 |
| 50 ... 540 | 35 ... 330 | 25 ... 220 |
| 50 ... 500 | 35 ... 300 | 25 ... 220 |
| 50 ... 270 | 35 ... 170 | 25 ... 120 |
| 300 ... 540 | 170 ... 330 | 120 ... 220 |
| 300 ... 500 | 170 ... 300 | 120 ... 220 |
| 400 ... 540 | 230 ... 330 | 160 ... 220 |
| 400 ... 500 | 230 ... 300 | 160 ... 220 |

The Table hereinafter lists in the left-hand column various preferred energy ranges for the implantation of P while the right-hand column sets out the corresponding depths of the maximum of the P profile.

| Energy range [keV] | Depth of the profile maximum with P doping [nm] |
| --- | --- |
| 100 ... 540 | 130 ... 750 |
| 100 ... 500 | 130 ... 700 |
| 200 ... 540 | 270 ... 750 |
| 200 ... 500 | 270 ... 700 |
| 300 ... 540 | 410 ... 750 |
| 300 ... 500 | 410 ... 700 |
| 300 ... 400 | 410 ... 570 |

It is also possible to introduce a plurality of implants which can differ in terms of kind of ion, energy and dose.

In addition so-called pre-amorphization implants, that is to say implants which specifically and targetedly destroy the semiconductor crystal in a given region can also be used. In particular electrically neutral implantation substances are suitable for that purpose, such Si or Ge for implantation into Si. By means of those implantations, it is possible to influence the degree of perfection of the healed (re-crystallized) regions.

In addition cover layers such as for example the insulator layers for embodying the insulating regions of second type can be specifically used in the implantation procedure in order to vary the depth of penetration.

For very high-speed transistors the profile of the first collector doping is preferably such that, after all diffusion steps, the level of concentration increases within less than 150 nm at least by 2 orders of magnitude, preferably within less than 80 nm by at least 2 orders of magnitude, still further limitedly within less than 40 nm by at least 2 orders of magnitude. In this case the collector doping can increase starting for example from a reference level of at least $1 \times 10^{17}$ cm$^{-3}$. However other reference levels of greater than $1 \times 10^{17}$ cm$^{-3}$, preferably up to $3 \times 10^{18}$ cm$^{-3}$, are also advantageous. The increase in the doping substance concentration by at least 2 orders of magnitude over the specified depth regions is preferably effected in such a way that the portion of the collector profile, which is distinguished in that fashion, begins at the collector-side base limit.

A second collector doping 14 is established in respect of lateral extent by the width of the opening in the insulating regions of second type as indicated at 20, 21. It can be introduced simultaneously with the lacquer mask for structuring of the insulating regions of second type by implantation and in that case is included in all bipolar transistors of the kind described in Example 1.

Preferably the same profile factors apply for the second collector doping, in production of very high-speed transistors, as for the first collector doping.

The second collector profile can be introduced in addition to the first one, it can be omitted, or it can be used without further collector profiles.

As no further requirements are made in terms of the structuring of the lacquer mask for the first collector doping as a distinction from structuring of the second one, the first collector doping can be selectively introduced into any transistor.

Using the first and second collector dopings affords the advantages that that affords transistors with different parameters and it is thus possible to meet varying circuitry requirements. If the second collector doping selected is a profile with a relatively low maximum doping substance concentration, preferably less than $3 \times 10^{17}$ cm$^{-3}$, then masking the first collector doping per layout in the case of a second kind of bipolar transistors, on one and the same substrate, means that the collector-emitter breakdown voltage achieved can be higher than in the case of the transistors of the first type, which have the first and second collector dopings.

A third collector doping 15 can be afforded simultaneously with structuring of the emitter window 41. The collector doping 15 is then self-positioned in relation to the emitter window 41. In that case all bipolar transistors are affected by the implantation procedure. It is however also possible, by means of an extra lacquer mask, to introduce the third collector doping only in a portion of the bipolar transistors. The third collector doping however is then not arranged in self-positioned relationship with respect to the emitter window.

The connection of the collector is implemented by way of the collector connection doping 12. The lateral extent is delimited on the one hand by the field insulating region 2. On the other hand the collector connection doping can extend as far as the opening of the second-type insulating region 20, 21 or can already terminate at the outer edge of that region, as is shown in FIG. 2.

The collector connection doping can be composed of a plurality of implants. Thus for example in a BiCMOS process, it is possible to use doping of the n-source/drain regions of the MOS-transistors or in addition the n-well which is required for producing the pMOS transistors.

Figure 3:
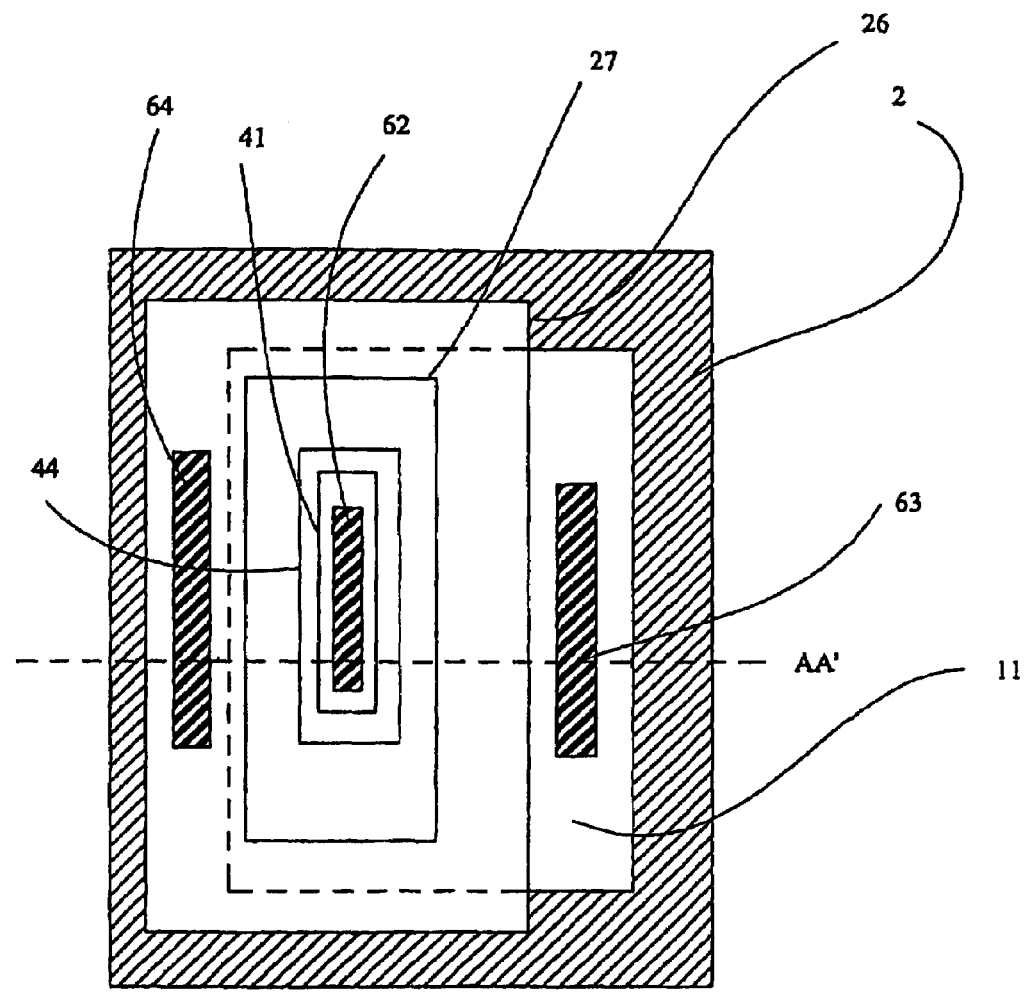
FIG. 3 shows a layout variant with respective single-side base and collector contact.
Figure 4:
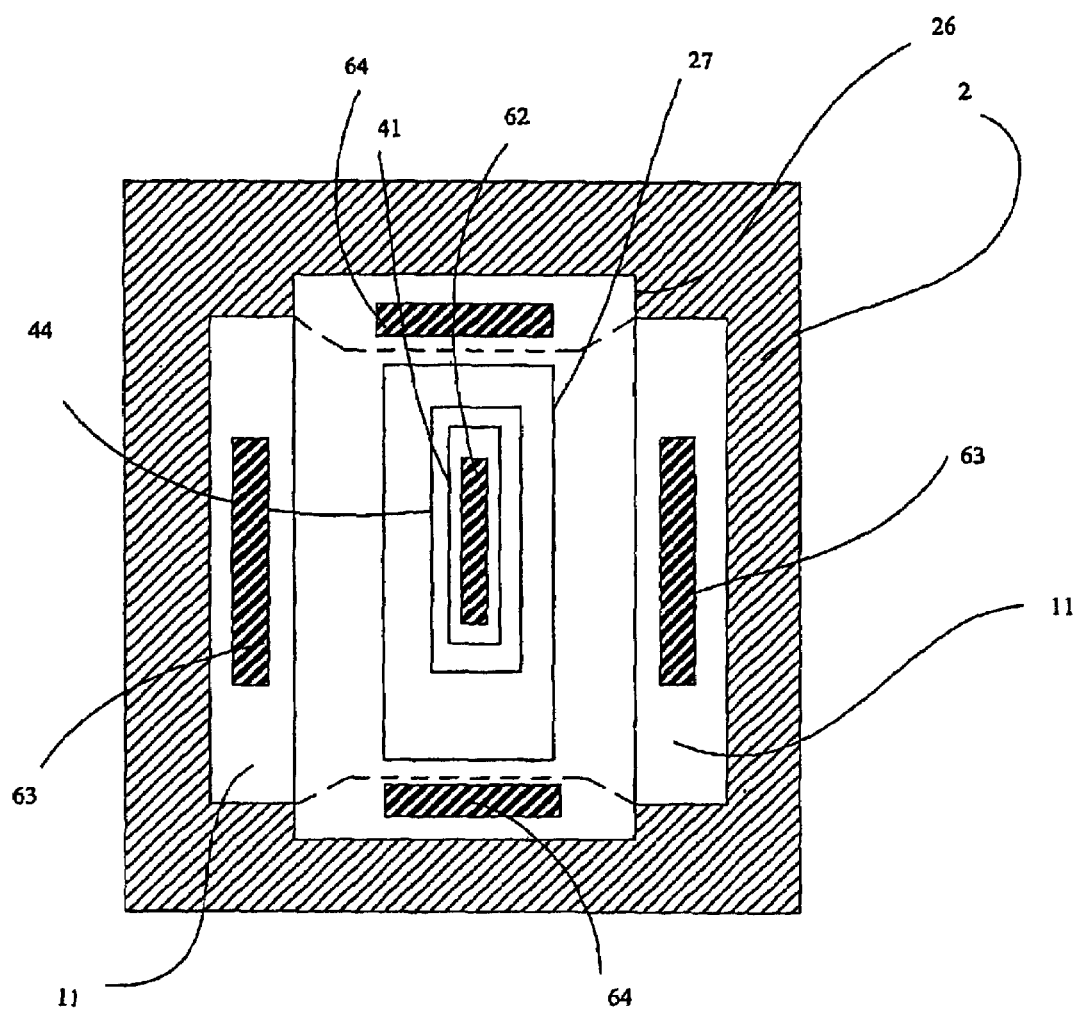
FIG. 4 shows a layout variant with respective double-side base and collector contact.

FIGS. 3 and 4 show layout variants, that is to say plan views of the essential structuring planes of the arrangement with epitaxial base in accordance with the invention. The field insulating region 2 encloses the collector contact region 11, the inner boundary of the insulating regions 27 of second type, the emitter layer 44 and the emitter window 41. The emitter, base and collector are connected by way of the contact regions 62, 63 and 64. FIG. 3 shows an example of a layout which corresponds along the section line AA' to the cross-section of the arrangement in FIG. 1. In this respect the base contact 64 and the collector contact 63 are each arranged on one side. FIG. 4 shows a variant which has two mutually oppositely disposed base contacts 64 and collector contacts 63 respectively. Along the lines of those variants, the man skilled in the art can easily arrive at further layout variants.

EXAMPLE 2

Figure 5:
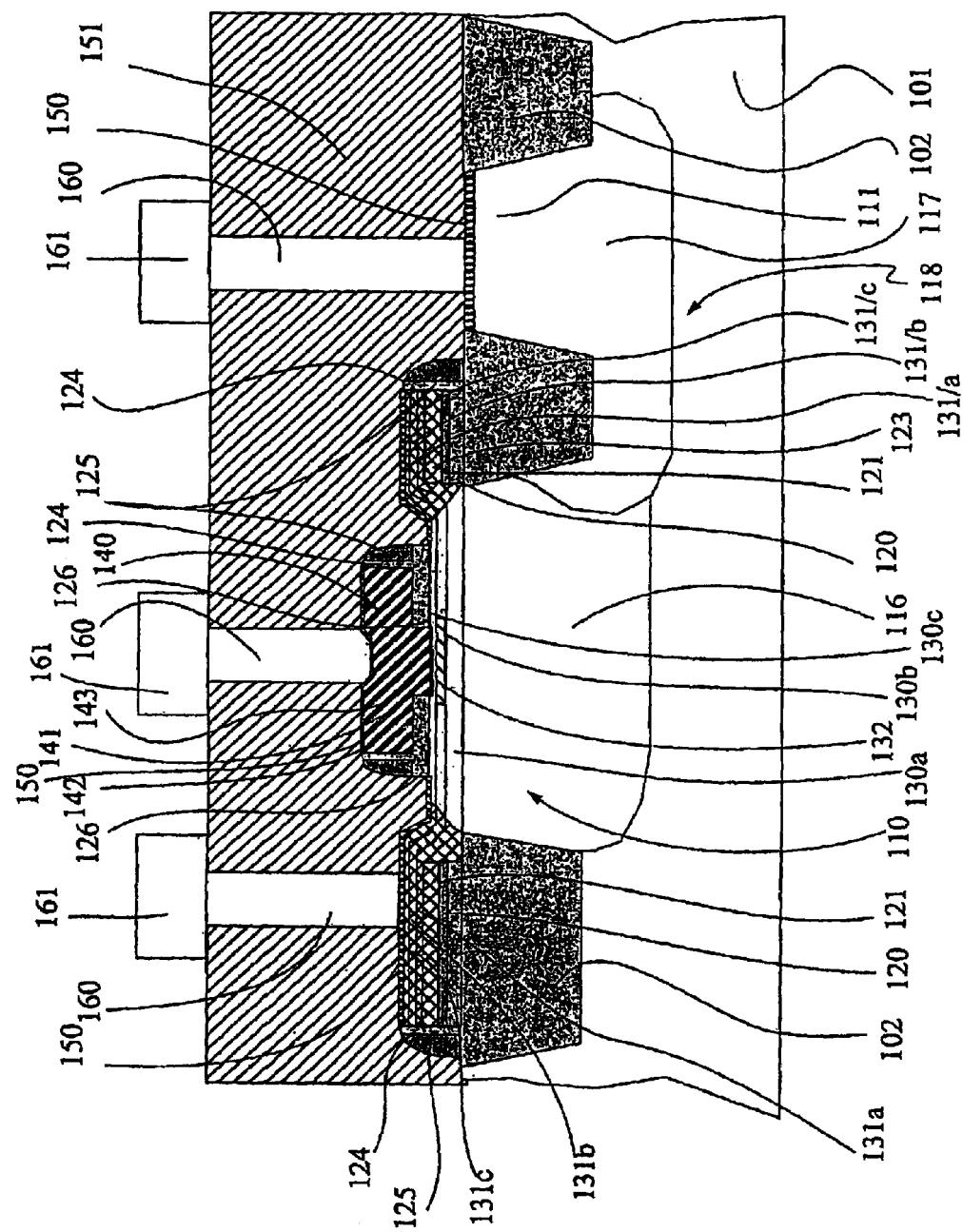
FIG. 5 shows a view in cross-section of a semiconductor device according to the invention in the form of a bipolar transistor.

The bipolar transistor according to the invention will now be described by means of a further embodiment with reference to FIG. 5. Features which differ from each other, in a comparison between Examples 1 and 2, are as follows: the collector 110 is passed laterally by way of the collector contact region 117 to the collector contact 111. The entire region which is disposed outside the inner transistor region and which in the semiconductor region makes the electrical connection to the collector contact is identified as the collector contact region 117. The inner transistor region can but does not have to be disposed with the collector contact region 111 in one and the same active region. Accordingly all configuring features of the collector doping which relate to the position of the transistor region in a single active region do not apply.

In Example 2 the inner transistor region and the collector contact region 111 are separated from each other by a field insulating region 2. A monocrystalline layer stack 130 can but does not have to be present between the emitter 140 and the collector 110, as stated in Example 2. It is also possible to produce a base layer with the usual means by means of implantation or diffusion. Whether then the base is or is not connected to the insulating region, as shown in Example 2, depends on the nature of the technology involved, but is not of significance in regard to the essence of the arrangement according to the invention of Example 2.

The insulating regions 120, 121 of second type which are present in Example 2 afford possible ways of facilitating integration of the bipolar transistor into a CMOS process and improving the properties of bipolar transistors, as set out in Example 1. They are however not essential for the arrangement according to the invention of Example 2. For those reasons, Example 2 also does not include the provision of spacers at the inner wall of the insulating regions of second type.

The structure and production of the emitter 140 and of auxiliary layers which are required for same may but do not have to be identical to Example 1. It is also possible to use conventional methods for producing an implanted emitter.

What is of essential significance for the arrangement described in Example 2 is the presence of a fourth collector doping 116 which in the horizontal direction embraces at least the inner transistor regions. The profile configuration in a vertical direction is substantially homogenous and the part which rises as steeply as possible and which is characteristic in the inner transistor region for conventional collector profiles such as for example in the case of a buried layer and which is typical in respect of so-called retrograde profiles is missing. The concentration of the fourth collector doping is such that the desired collector-emitter breakdown voltage can be achieved.

In addition the arrangement in Example 2 is characterized by the high doping 118 which extends laterally to the fourth collector doping 116 or partially covers it over. That doping is preferably such that there is a low-ohmic connection to the collector contact.

The high doping 118 can be formed by a special, so-called collector shaft implantation operation or, in dependence on the process implementation involved, it can be formed from a plurality of dopings of the conductivity type of the collector. In the bipolar process for example buried layer doping is available for that purpose. In the BiCMOS process, depending on the respective bipolar transistor type, an n- or p-well and in the region near the surface the high dopings for source/drain can be produced.

The depth and the lateral spacing of the high doping 118 relative to the inner transistor region are preferably such that the lateral spread of the collector-base space-charge zone, under operating conditions, permits the desired collector-emitter breakdown voltage. In addition the collector resistance can be reduced if the high doping 118 reaches the fourth collector doping not just at one side but also encloses it at two sides, in a U-shape or in an annular configuration. That arrangement can be produced by means of a layout. That structure means that it is obviously possible to achieve greater collector-emitter breakdown voltages, for example >6V, with the simultaneous setting of conventional current strength values >70, without being dependent on the use of high-energy implantation or an epitaxially buried layer, and without loses in terms of high-speed performance having to be accepted.

An additional degree of freedom in terms of setting the BVCEO is enjoyed with the arrangement according to the invention insofar as the lateral spacing of the high doping 118 relative to the inner transistor region is modified by means of the layout. To reduce the contribution to the collector resistance, which occurs due to the current path in the high doping 118, it is possible to use specific targeted adjustment of the lateral edge contour of the high doping, having regard to the spread of the charge carriers in the collector-base space-charge zone. That design variant is based on the fact that modern high-speed transistors have emitter widths (shortest lateral extent of the emitter window) which approximately correspond to the length of the base-collector space-charge zone which transistors with BVCEO >4 to 5V at least require. In such transistors the collector resistance can be lowered if the flight time of the charge carriers and charge carrier multiplication in the base-collector space-charge zone is minimized at the same time. Lateral curvature of the region of the high doping can advantageously be used for that purpose, being adapted to the radially or cylindrically symmetrical configuration of the collector-side base-collector space-charge zone limit. In particular, at the expense of a higher capacitance between the base connection region and the collector, which influences the high-speed properties with a lower weight than the capacitance between the inner base and the collector, the collector resistance can be lowered by lateral offshoots of the high doping 118, which are in opposite relationship to the doping of the base connection, without the collector-emitter breakdown voltage suffering. In that respect radially symmetrical and cylindrically symmetrical are not to be interpreted in a strict mathematical sense but as an approximation to the actual shape which for example can also be pear-shaped.

The invention claimed is:

1. A semiconductor device comprising: a semiconductor substrate (1) including an active region (3), a field insulating region (2) that delimits the active region (3) of the semiconductor substrate (1), a collector (10), at least one collector contact region (11) associated with the collector (10), and a base (30b) with an associated base connection region (31a, b, c)

wherein the collector (10) and the collector contact region (11) are both formed in the active region (3), wherein the base connection region (31a, b, c) extends partially over the active region (3) away from the surface of the semiconductor substrate (1) and is separated from the surface of the active region (3) by an insulator layer (20, 21), and wherein the field insulating region (2) extends in a direction away from the surface of the semiconductor substrate (1) an extent of between 100 nm and 600 nm, and the collector (10) extends in the same direction no farther than the field insulating region (2).

2. A semiconductor device as set forth in claim 1 characterized in that the base includes an epitaxial base layer (30b).

3. A semiconductor device as set forth in claim 2 characterized in that the epitaxial base layer (30b) includes an alloy which includes the substrate material and a further semiconductor material.

4. A semiconductor device as set forth in claim 3 characterized in that the substrate material is silicon and the further semiconductor material is germanium.

5. A semiconductor device as set forth in claim 2 characterized in that the epitaxial base layer (30b) contains carbon.

6. A semiconductor device as set forth in claim 1 characterized in that between the collector (10) and the base (30b) and at the side walls of the insulator layer (20, 21) is a buffer layer (30a) which is at least of a partially monocrystalline nature at the side walls of the insulator layer (20, 21).

7. A semiconductor device as set forth in claim 1 characterized in that there is provided a collector doping with a doping substance concentration which in the active region at the substrate surface is at least 5×1017 cm−3.

8. A semiconductor device as set forth in claim 7 characterized in that the doping substance concentration of the collector doping in the active region at the substrate surface is at least 3×1018 cm−3.

9. A semiconductor device as set forth in claim 7 characterized in that the doping substance concentration of the collector doping in the active region at the substrate surface is at least 1×1019 cm−3.

10. A semiconductor device as set forth in claim 1 characterized in that the insulator layer includes at least two material layers (20, 21).

11. A semiconductor device as set forth in claim 1 characterized in that the insulator layer (20, 21) has side walls at which spacers (22) are formed.

12. A semiconductor device as set forth in claim 1 characterized in that there is a conductive layer (23) between the insulator layer (20, 21) and the base connection region (30a, b, c).

13. A semiconductor device as set forth in claim 1 characterized in that the insulator layer (20, 21) on the surface of the active region (3) represents a limit which subdivides the active region into the collector (10) and the collector contact region (11).

14. A semiconductor device as set forth in claim 1 characterized in that an inner opening which is delimited by side walls of the insulator layer and which surrounds a part of the inner transistor region is completely enclosed by the field insulating regions.

15. A semiconductor device as set forth in claim 14 characterized in that the lateral spacing of the inner opening of the insulating regions of second type from the inner boundary of the field insulating regions is at least 20 nm.

16. A semiconductor device comprising a semiconductor substrate (2) having an active region (3) and an insulator layer (20, 21) on a part of the surface of the active region (3), and also comprising a base (30b), a collector (10), a collector contact region (11) and a doping which extends in the lateral direction at least through a part of the collector (10), wherein the doping has a concentration profile with a base-side flank on which the doping substance concentration increases by at least 2 orders of magnitude starting from a reference level of at least $1\times10^{17}$ cm$^{-3}$ with increasing depth over a depth region of less than 150 nm, and wherein the doping is provided in the whole of the active region (3) so as to extend away from the surface of the active region 3) of the semiconductor surface (1) no farther than the insulator layer (20, 21).

17. A semiconductor as set forth in claim 16 characterized in that the doping substance concentration increases by at least 2 orders of magnitude with increasing depth over a depth region of up to 150 nm, calculated from the collector-side base limit.

18. A semiconductor as set forth in claim 16 characterized in that the doping substance concentration increases by at least 2 orders of magnitude with increasing depth over a depth region of up to 80 nm, calculated from the collector-side base limit.

19. A semiconductor as set forth in claim 16 characterized in that the doping substance concentration increases by at least 2 orders of magnitude with increasing depth over a depth region of up to 40 nm, calculated from the collector-side base limit.

20. A semiconductor device as set forth in claim 16 characterized in that the concentration profile at a distance from the base (30b) of at most 70 nm has a doping substance concentration of more than 5×1018 cm−3.

21. A semiconductor device as set forth in claim 16 characterized in that the concentration profile does not exceed a doping substance concentration of 5×1017 cm−3 at least as far as a distance of 30 nm from the base (30b).

22. A semiconductor device as set forth in claim 16 characterized in that the doping extends both through the collector (10) and also through the collector contact region (11).

23. A semiconductor device as set forth in claim 16 characterized in that the doping includes a first collector doping (13) and a second collector doping (14), wherein the first collector doping (13) extends laterally both through the collector (10) and also through the collector contact region (11) and the second collector doping (14) extends laterally only through the collector (10).

24. A semiconductor device as set forth in claim 16 characterized in that it includes a field insulating region (2) and a doped substrate (1) and the concentration profile has a substrate-side flank, wherein the doping substance concentration in the substrate-side flank of the concentration profile approximately reaches the doping substance concentration of the substrate doping at a depth which corresponds to the underside of the field insulating region (2).

25. A semiconductor device as set forth in claim 16, and including a substrate (1), a field insulating region (2) which delimits an active region (3) of the semiconductor substrate (1), at least one collector contact region (11) associated with the collector (10), and a base connection region (30a, b, c) associated with the base (30b), wherein the collector (10)

and the collector contact region (11) are formed in the same active region (3) characterized in that the base connection region (30a, b, c) extends partially over the active region (3) and is separated from the surface of the active region (3) by an insulator layer (20, 21).

26. A semiconductor device as set forth in claim 25 characterized in that provided in the collector (10) is a second collector doping (14) whose lateral extent is determined by the insulator layer (20, 21).

27. A process for producing a semiconductor device including the following steps:
   depositing an insulator layer (20, 21) on a part of the surface of an active region (3) of a semiconductor substrate (1), so as to subdivide the active region (3) into a collector (10) and at least one collector contact region (11),
   depositing a base layer (30b) on the collector (10),
   depositing a polycrystalline layer (31a, 31b, 31c) on the insulator layer (20, 21), and
   introducing a first collector doping (13) into the whole of the active region (3) so as to arrange that the collector doping (13) extends away from the surface of the active region (3) of the semiconductor surface (1) no farther than the insulator layer (20, 21).

28. A process as set forth in claim 27 characterized in that it also includes a step of structuring the insulator layer (20, 21).

29. A process as set forth in claim 27 characterized in that the step of depositing the base layer (30b) is effected by means of epitaxy.

30. A process as set forth in claim 29 characterized in that prior to the epitaxy step spacers (22) are produced at the side walls of the insulator layer (20, 21) in order to delay seeding of the side walls during the epitaxy step.

31. A process as set forth in claim 29 characterized in that the step of depositing the base layer (30b) is effected by means of selective epitaxy.

32. A process as set forth in claim 29 characterized in that the step of depositing at least a part of the base layer (30b) and a part of the polycrystalline layer (31a, 31b, 31c) is effected in a common working step.

33. A process as set forth in claim 32 characterized in that the step of depositing the part of the base layer (30b) and the part of the polycrystalline layer (31a, 31b, 31c) is effected by means of differential epitaxy.

34. A process as set forth in claim 33 characterized in that germanium and/or carbon is introduced both into the monocrystalline layer and also into the polycrystalline layer (31a, 31b, 31c).

35. A process as set forth in claim 33 characterized in that in addition to the base layer (30b) a monocrystalline layer is deposited as a cap layer (30c) and a monocrystalline layer is deposited as a buffer layer (30a).

36. A process as set forth in claim 35 characterized in that when depositing the layer stack of buffer, base and cap layers, the procedure is changed between selective and differential epitaxy.

37. A process as set forth in claim 35 characterized in that carbon involving different levels of concentration is introduced into the cap layer (30c), into the base (30b) and into the buffer layer (30a).

38. A process as set forth in claim 27 characterized in that a second collector doping (14) is introduced into the collector (10), the lateral extent of the second collector doping (14) being determined by the insulator layer (20, 21), and in that a first collector doping (13) is introduced into the whole of the active region (3).

39. A process as set forth in claim 29 characterized in that no other epitaxy step is effected between the introduction of the first and/or the second collector doping (13, 14) and the epitaxy step for depositing the base (30b), and in that a first collector doping (13) is introduced into the whole of the active region (3).

40. A semiconductor device including a substrate (101) and a collector (110) characterized in that the collector (110) includes a collector doping (116), the doping profile of which is substantially homogenous in a vertical and/or lateral direction and which is designed to rise scarcely or not at all towards the substrate (101), and in that the collector doping (116) is laterally enclosed by a higher doping on two sides or in a U-shape or an annular configuration, and further characterized in that there is also a collector contact region (111) and the higher doping (118) is in the form of a low-ohmic connection to the collector contact region (111).

41. A semiconductor device as set forth in claim 40 characterized in that the higher doping (118) laterally contacts the collector doping (116).

42. A semiconductor device as set forth in claim 41 characterized in that the higher doping (118) partially overlaps the collector doping (116).

43. A semiconductor device as set forth in claim 40 characterized in that there is a inner transistor region and that the doping profile extends in the lateral direction at least over the inner transistor region.

44. A semiconductor device as set forth in claim 40 characterized in that there are also a base (130b) and an emitter (140) and that the higher doping (118) extends from the surface of the substrate (101) at least to a depth which corresponds to the substrate-side limit of a space-charge zone between the base (130b) and the collector (110), which is present when a voltage which leads to a collector-emitter breakdown is applied between the collector (110) and the emitter (140).

45. A semiconductor device as set forth in claim 40 characterized in that the higher doping (118) is in the form of a well as is typically used in CMOS devices.

46. A semiconductor device as set forth in claim 40 characterized in that the higher doping (118) is in the form of a buried layer.

47. A semiconductor device as set forth in claim 40 characterized in that it is in the form of a bipolar transistor.

48. A semiconductor device, in particular a bipolar transistor, having a collector region and a substantially homogenous collector doping which rises scarcely or not at all towards the substrate, wherein the collector doping is laterally enclosed on two sides or in a U-shape or an annular configuration by a higher doping, and further characterized in that there is also a collector contact region and the higher doping is in the form of a low-ohmic connection to the collector contact region.

49. A semiconductor chip including at least two bipolar transistors, wherein at least one bipolar transistor is designed as set forth in one of claim 48 and the bipolar transistors each include a respective buried layer which is not necessarily continuous, and wherein the buried layers form a common buried layer of the semiconductor chip, which at least in one bipolar transistor is also present under the inner transistor region.

50. A process for producing a bipolar transistor including the following steps:
   introducing a collector doping (116) such that the doping profile is substantially homogenous in the vertical direction and rises scarcely or not at all towards the substrate, introducing laterally in contact with the collector doping (116) a higher doping (118), and with the collector doping (116) laterally enclosed by the higher doping (118) on two sides or in a U-shape or an annular configuration, and introducing a collector contact region (111), and wherein the higher doping (118) is introduced so as to provide a low-ohmic connection to the collector contact region (111).

51. A process as set forth in claim 50 wherein the higher doping (118) is introduced in such a way that it overlaps the collector doping (116).

52. A process as set forth in claim 51 characterized in that the degree of overlap is so selected that the collector-emitter breakdown voltage is set to a predetermined value.

53. A process as set forth in claim 51 characterized in that the spacing of the higher doping (118) from the collector surface when introducing the higher doping (118) is so selected that the collector-emitter breakdown voltage is set to a predetermined value.

54. A process as set forth in claim 53 wherein the spacing of the high doping (118) from the collector surface is adjusted by an epitaxy layer being deposited on the higher doping (118) after the operation of introducing the high doping (118).

55. A process as set forth in claim 54 wherein the higher doping is introduced by means of ion implantation and the spacing of the high doping (118) from the collector surface is adjusted by the choice of the implantation parameters.

56. A process as set forth in claim 50 characterized in that the higher doping (118) is introduced in a plurality of steps.

57. A process as set forth in claim 50 characterized in that at least a part of the higher doping (118) is introduced together with a well which is used for an MOS-transistor.

* * * * *

UNITED STATES PATENT AND TRADEMARK OFFICE
CERTIFICATE OF CORRECTION

PATENT NO. : 7,323,390 B2
APPLICATION NO. : 10/496531
DATED : January 29, 2008
INVENTOR(S) : Heinemann et al.

Page 1 of 1

It is certified that error appears in the above-identified patent and that said Letters Patent is hereby corrected as shown below:

1. In column 15, line 3, claim 1, line 7, after "(31a, b, c)" --,-- should be inserted.

2. In column 15, line 57, claim 12, line 4, "(30a, b, c)" should be --(31a, b, c)--.

3. In column 16, line 4, claim 15, line 4, "20nm" should be --25nm--.

4. In column 16, line 17, claim 16, line 13, "3)" should be --(3)--.

5. In column 16, line 66, claim 25, line 5, "(30a, b, c)" should be --(31a, b, c)--.

6. In column 17, line 3, claim 25, line 9, "(30a, b, c)" should be --(31a, b, c)--.

Signed and Sealed this

Tenth Day of June, 2008

JON W. DUDAS
*Director of the United States Patent and Trademark Office*